(12) United States Patent
Hausmann et al.

(10) Patent No.: US 7,839,208 B2
(45) Date of Patent: Nov. 23, 2010

(54) INTEGRATED CIRCUIT AND METHOD FOR OPERATING

(75) Inventors: Michael Hausmann, Gleisdorf (AT); Axel Reithofer, Graz (AT)

(73) Assignee: Infineon Technologies AG, Neubiberg (DE)

(*) Notice: Subject to any disclaimer, the term of this patent is extended or adjusted under 35 U.S.C. 154(b) by 282 days.

(21) Appl. No.: 11/965,959

(22) Filed: Dec. 28, 2007

(65) Prior Publication Data
US 2009/0166617 A1    Jul. 2, 2009

(51) Int. Cl.
*G11C 7/10* (2006.01)
*G06F 13/14* (2006.01)
*H03K 19/0175* (2006.01)

(52) U.S. Cl. .................. 327/564; 327/333; 327/62; 365/189.03

(58) Field of Classification Search .................. None
See application file for complete search history.

(56) References Cited

U.S. PATENT DOCUMENTS

| | | | | |
|---|---|---|---|---|
| 4,063,225 A * | 12/1977 | Stewart | ..................... | 365/156 |
| 4,678,950 A * | 7/1987 | Mitake | ..................... | 327/321 |
| 5,043,606 A * | 8/1991 | Lewis | ..................... | 326/80 |
| 5,594,694 A * | 1/1997 | Roohparvar et al. | ..................... | 365/201 |
| 5,680,591 A * | 10/1997 | Kansal et al. | ..................... | 345/571 |
| 5,818,251 A * | 10/1998 | Intrater | ..................... | 324/765 |
| 5,844,849 A * | 12/1998 | Furutani | ..................... | 365/194 |
| 5,973,521 A * | 10/1999 | Kim et al. | ..................... | 327/112 |
| 7,215,150 B2 * | 5/2007 | Torres et al. | ..................... | 326/83 |
| 7,449,940 B2 * | 11/2008 | Sunairi | ..................... | 327/541 |

* cited by examiner

*Primary Examiner*—Lincoln Donovan
*Assistant Examiner*—Terry L Englund
(74) *Attorney, Agent, or Firm*—Dicke, Billig & Czaja, PLLC

(57) ABSTRACT

An integrated circuit and a method for operating an integrated circuit is disclosed. One embodiment provides a semi-conductor component, an electronic system, and a method for operating an integrated circuit. A method for operating an integrated circuit provides applying a voltage to a line or a connection in accordance with data to be input. A current is applied to the line or the connection in accordance with data to be output.

23 Claims, 3 Drawing Sheets

INTEGRATED CIRCUIT AND METHOD FOR OPERATING

BACKGROUND

The present invention relates generally to an integrated circuit, a semi-conductor component, an electronic system, and a method for operating an integrated circuit.

Semi-conductor components, for example, corresponding integrated (analog and/or digital) circuits, semi-conductor memory components such as for instance function memory components (PLAs, PALs, etc.) and table memory components (for example, ROMs or RAMs, particularly SRAMs and DRAMs), etc. are subjected to numerous tests in the course of the manufacturing process.

For the simultaneous manufacture of a plurality of (generally identical) semi-conductor components or integrated circuits, a wafer (for example, a thin disk consisting of monocrystalline silicon) is used. The wafer is appropriately processed (for example, subjected to numerous of coating, lighting, etching, diffusion implantation processes, etc.), and subsequently sawn up (or for example, scored and snapped off), so that the individual components/integrated circuits/chips are made available.

During the manufacture of semi-conductor components/integrated circuits the components/circuits still on the wafer and incomplete may be subjected to corresponding test procedures (for example, kerf measurements) even before all the required above processing steps have been performed on the wafer (that is, even while the semi-conductor components/integrated circuits are still semi-complete). This may be done at one or several test stations by using one or several test apparatuses.

After the semi-conductor components/integrated circuits have been completed (that is, after all the above wafer processing steps have been executed) the semi-conductor components/integrated circuits are subjected to further test procedures at one or several (further) test stations—for instance the components still present on the wafer and completed may be tested with the help of corresponding (further) test apparatuses ("disk tests").

In similar fashion several further tests may be performed (at corresponding further test stations and by using additional corresponding test apparatuses) for example, after the semi-conductor components/integrated circuits/chips have been installed in corresponding semi-conductor component housings, and/or for example, after the semi-conductor component housings (together with the semi-conductor components/integrated circuits/chips installed in them) have been installed in corresponding electronic modules (so-called "module tests").

With the aid of above test procedures, for example, defective semi-conductor components/chips/modules can be identified and then eliminated (or else partially repaired), and/or the process parameters—used during the manufacture of the components in each case—can be appropriately modified and/or optimized in accordance with the test results achieved, and/or respective trimmings can be performed, etc.

For carrying out the above tests, the semi-conductor components/integrated circuits/chips may be brought from a normal operating mode to a test mode.

In the test mode, for instance, chip-internal data not accessible during the normal operating mode may be read.

In one embodiment, in the test mode, data may be written onto storage locations not accessible during the normal operating mode.

For instance, in the test mode, a serial number (ChipID) unique for a respective semi-conductor component/integrated circuit/chip may be read by the respective test apparatus. Further, in the test mode, data may be written into a chip-internal EEPROM used for trimming respective amplifier parameters of the semi-conductor component/integrated circuit/chip, etc.

For the test mode, one or several separate pins/pads may be provided at the respective semi-conductor component/integrated circuit/chip. These pins/pads are exclusively used during the test mode, and not during the normal operating mode. However, this approach leads to a relatively large total number of pins/pads.

In one embodiment, one or several pins/pads during the test mode might have a different function than during the normal operating mode. This approach, however, might lead to an enhanced complexity of the respective integrated circuit.

For these or other reasons, there is a need for the present invention.

SUMMARY

Embodiments of the invention relate to an integrated circuit, a semi-conductor component, an electronic system, and a method for operating an integrated circuit.

According to one embodiment, a method for operating an integrated circuit includes: applying a voltage to a line or a connection in accordance with data to be input, and applying a current to the line or the connection in accordance with data to be output.

According to a further embodiment, an integrated circuit includes a bidirectional connection for the input and output of data.

Further features and advantages of the present invention will become apparent from the following detailed description of the invention made with reference to the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
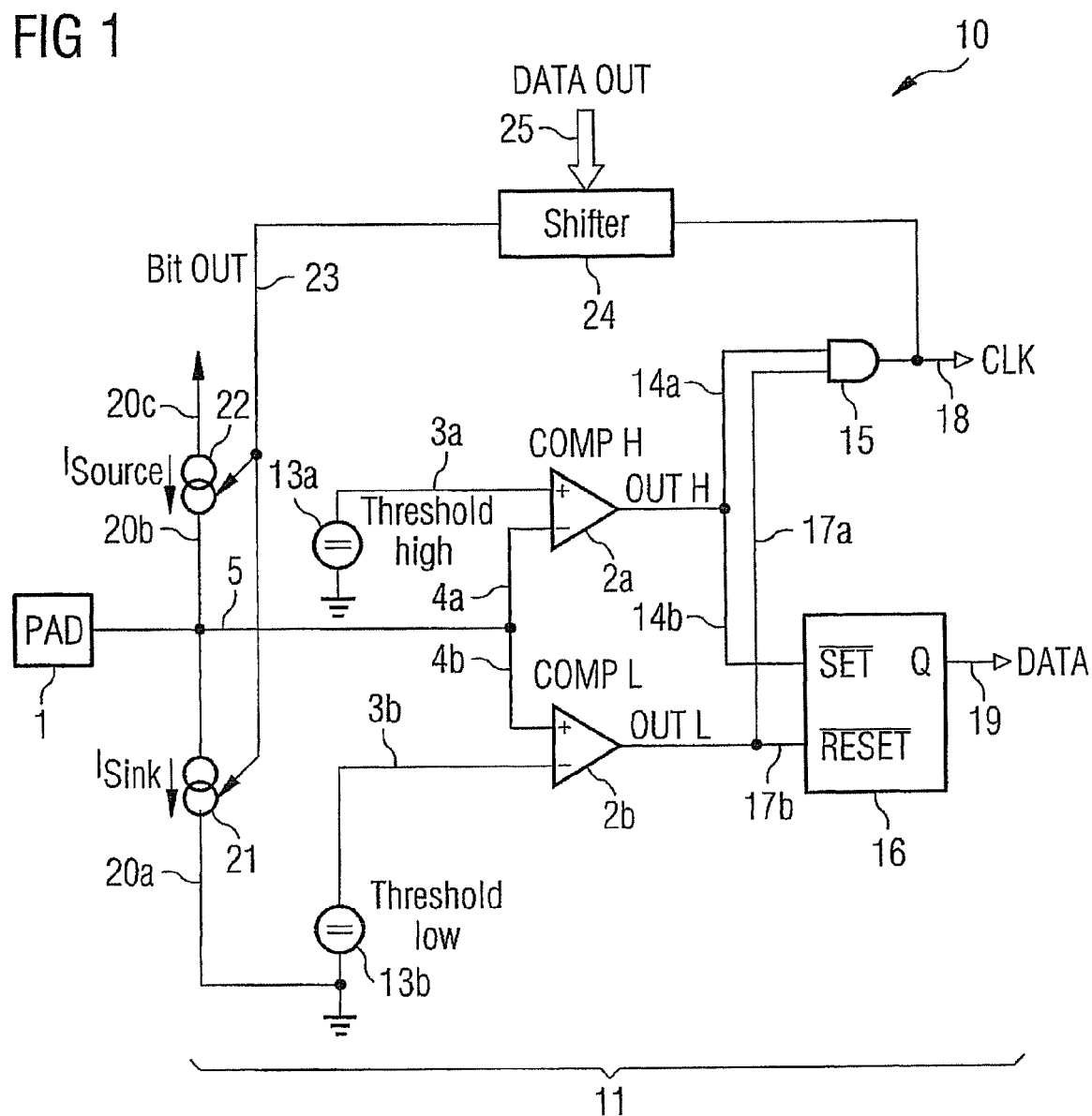
FIG. 1 illustrates a schematic, exemplary view of an exemplary section of an integrated circuit according to an embodiment.

FIG. 1 illustrates a schematic, exemplary view of an exemplary section 10 of an integrated circuit according to an embodiment of the present invention.

In accordance with the present embodiment, the integrated circuit may for example, be a respective (analog and/or digital) integrated circuit, for example, a microcontroller, a microprocessor, a memory component (for example, a PLA, a PAL, a ROM, a PROM, an EPROM, an EEPROM, a Flash memory, a RAM (for example, a DRAM or SRAM), etc.), or any other suitable integrated circuit.

The integrated circuit may for example, be arranged on a respective semiconductor chip.

As is illustrated in FIG. 1, the integrated circuit may include a pad 1, by use of which as will be described in further detail below data may be input in the integrated circuit, and/or data may be output from the integrated circuit.

In addition to the pad 1 illustrated in FIG. 1, the integrated circuit correspondingly similar as conventional integrated circuits may include a plurality of additional (conventional) pads (not illustrated in FIG. 1).

The pads for example, may be connected via respective bonding wires to respective pins at a housing of the integrated circuit.

The pad 1 may for example, serve to input data in/output data from the integrated circuit when the integrated circuit is tested, for example, to input/output respective test data, for instance, during a test mode of the integrated circuit. The test data for example, may be a serial number (ChipID) unique for the respective integrated component/circuit/chip, and stored in a respective register of the component/circuit/chip, or any other kind of test data or data used for testing, for example, data input in the integrated circuit and stored in an internal memory, for example, an EEPROM, and for example, used to trim the respective integrated circuit, etc.

The above test of the integrated circuit for example, may be carried out when the integrated circuit still is provided together with multiple other integrated circuits on a respective wafer, or for example, before or after installing the integrated circuit into a respective housing, or for example, after installing the housing with the integrated circuit in a respective electronic module, etc.

In one embodiment, the pad 1 or a pad corresponding to the pad 1 illustrated in FIG. 1 might also serve to input data in/output data from the integrated circuit in a normal operating mode of the integrated circuit, for example, to input and/or output respective normal, useful data, for example, in a way correspondingly similar or identical as will be described in further detail below in connection with FIG. 1.

The pad 1 for example, might be used exclusively for testing, that is, during the test mode of the integrated circuit. During the test, a test apparatus/tester (not illustrated) may be connected with the pad 1.

In one embodiment, the pad 1 may be used both during the test mode of the integrated circuit (for example, for the input and/or output of test data), and during the normal operating mode of the integrated circuit (for example, for the input and/or output of normal, useful data). In a variant, the pad 1 may be designed switchable between two different interfaces, a first interface 11 to which the pad 1 is connected during the test mode (illustrated in FIG. 1), such that during the test mode (test) data may be input into/output from the integrated circuit as will be described in further detail below, and a second interface (not illustrated) to which the pad 1 is connected during the normal operating mode, such that (normal) data may be input into or output from the integrated circuit in a conventional way during the normal operating mode (for example, by use of respective conventional receiver/transmitter circuits provided in the second interface). In this case, during the test mode, a test apparatus/tester (not illustrated) may be connected with the pad 1, and during the normal operating mode, any conceivable device, for example, a further integrated circuit or chip or electronic module, etc., for example, a (analog and/or digital) integrated circuit/a microcontroller/a microprocessor/a memory component, etc.

As is illustrated in FIG. 1, the interface 11 includes two comparators 2a, 2b. A plus input (+) of the first comparator 2a (COMP H) is connected via a line 3a to a first connection of a voltage source 13a providing a first constant reference voltage (THRESHOLD high/THRESHOLD H). Correspondingly inversely, a minus input (−) of the second comparator 2b (COMP L) is connected via a line 3b to a first connection of a voltage source 13b providing a second constant reference voltage (THRESHOLD low/THRESHOLD L).

As is further illustrated in FIG. 1, a minus input (−) of the first comparator 2a (COMP H) is connected via a line 4a to a line 5 which is connected to the pad 1.

Inversely, a plus input (+) of the second comparator 2b (COMP L) is connected via a line 4b to the line 5 (and hence, also to the pad 1, and via the line 4a to the minus input (−) of the first comparator 2a).

As is further illustrated in FIG. 1, the output of the first comparator 2a (OUTH) is connected via a line 14a to a first input of an AND gate 15, and via a line 14b to a first input, here: a SET/inverse SET input of a Flip-Flop (here: an RS Flip Flop 16).

Further, the output of the second comparator 2b (OUTL) is connected via a line 17a to a second input of the AND gate 15, and via a line 17b to a second input, here: a RESET/inverse RESET input of the Flip-Flop (here: the RS Flip Flop 16).

The output of the AND gate 15 via a line 18 is connected to a clock output (CLK output) of the interface 11. Further, the output of the Flip Flop 16 is connected via a line 19 to a data output (DATA) of the interface 11.

As is further illustrated in FIG. 1, a second connection of the voltage source 13a is connected to ground. In addition, a second connection of the voltage source 13b is connected to ground, and via a line 20a is connected to a first connection of a current source 21. A second connection of the current source 21 is connected to the above line 5, and hence, to the pad 1, the minus input of the first comparator 2a, the plus input of the second comparator 2b, and—via a line 20b—to a first connection of a current source 22, a second connection of which is connected to a line 20c.

The current source 22—if activated—provides a current Isource, and the current source 21—if activated—provides a current Isink. The current sources 21, 22 as will be described in further detail below are activated/deactivated in response to a signal Bit OUT on a line 23, which is connected to an output of a shift register 24.

Into the shift register 24, via a plurality of parallel lines 25, data to be output by the interface 11/the pad 1 is input. Hence, the shift register 24 performs a serialization of the data (DATA OUT) to be output by the interface 11/the pad 1.

Figure 3:
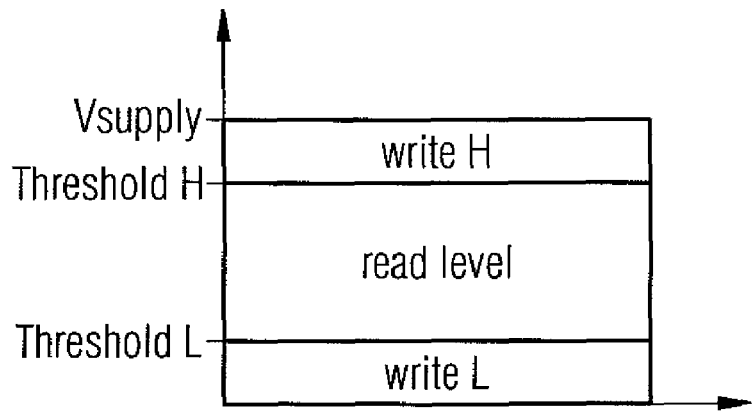
FIG. 3 illustrates a schematic, exemplary illustration of voltage levels at the pad of the section of the integrated circuit illustrated in FIGS. 1 and 2 and associated working modes of the integrated circuit.

As will be described in further detail below, to input data in the integrated circuit via the pad 1, as is illustrated in FIG. 3, two different voltage levels are used, which may be defined with regard to the above voltage levels THRESHOLD high/ THRESHOLD H, and THRESHOLD low/THRESHOLD L. If the voltage present at the pad 1 is above the voltage level THRESHOLD high/THRESHOLD H, or is below the voltage level THRESHOLD low/THRESHOLD L, data is input to the integrated circuit ("writing mode"). In the writing mode, as will be described in further detail below, the input of data takes place in the voltage domain (here: by use of the voltage present at the pad 1). In contrast, and as is illustrated in FIG. 3, if the voltage present at the pad 1 is below the voltage level THRESHOLD high/THRESHOLD H, and above the voltage level THRESHOLD low/THRESHOLD L, that is, if the voltage present at the pad 1 is at a "read level", no data is input to the integrated circuit via the pad 1. Instead, data is output. As will be described in further detail below, the output of data takes place in the current domain (here: by use of the current flowing through the pad 1).

Figure 4:
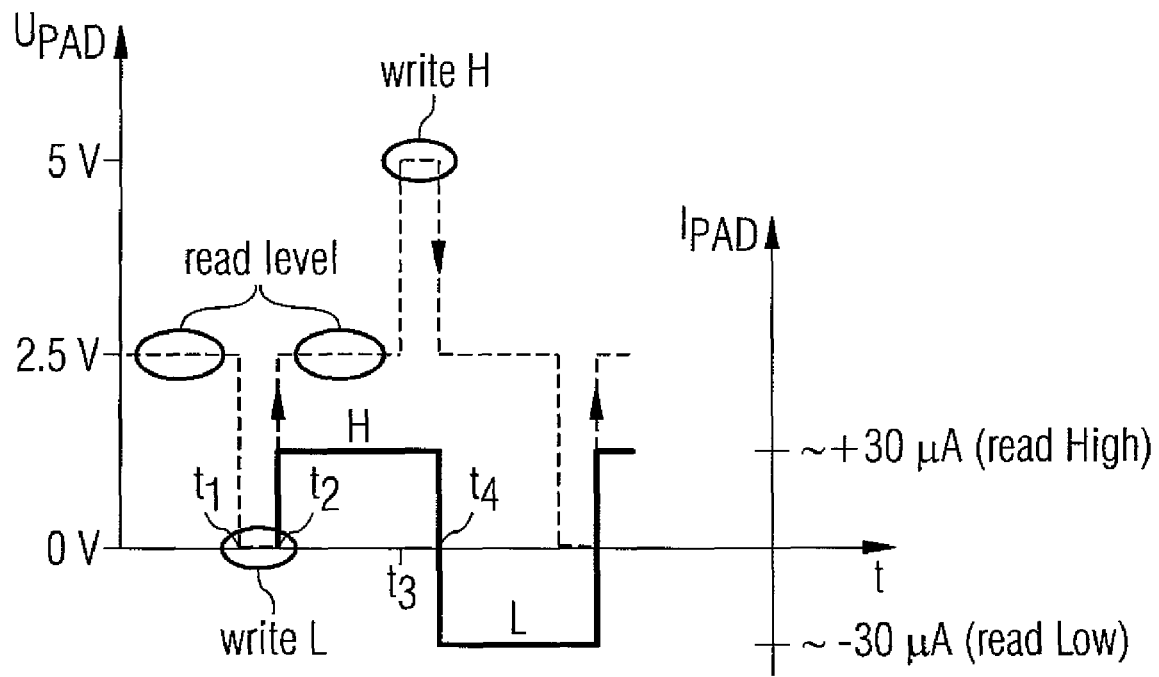
FIG. 4 illustrates a schematic, exemplary illustration of the possible course of voltages/currents at the pad.

In more detail, if a Bit "1" (or a Bit "0") is to be input into the integrated circuit, a voltage bigger than the above voltage level THRESHOLD high/THRESHOLD H, for example, a voltage of approximately 5V is applied at the pad 1 (see FIG. 4, and FIG. 3: "write H"). In contrast, as also illustrated in FIG. 4, if a Bit "0" (or alternatively a Bit "1") is to be input into the integrated circuit, a voltage lower than the above voltage level THRESHOLD low/THRESHOLD L, for example, a voltage of approximately 0V is applied at the pad 1 (see FIG. 4, and FIG. 3: "write L").

Further, if a Bit "1" (or alternatively a Bit "0") is to be output from the integrated circuit, a relatively high current Isource, for example, a positive current of approximately +30 μA is output at the pad 1 (see FIG. 4, "read High"). In contrast, as also illustrated in FIG. 4, if a Bit "0" (or alternatively a Bit "1") is to be output from the integrated circuit, a current lower than the above current Isource, that is, a relatively low current Isink, for instance a negative current, for example, a current of approximately −30 μA is output at the pad 1 (see FIG. 4, "read Low") (such that the direction of the current flow at the Pad 1 changes depending on whether a Bit "1" or a Bit "0" is output).

As is illustrated in FIG. 1, the voltage present at the pad 1 is compared by the first comparator 2a with the above voltage THRESHOLD high/THRESHOLD H (provided by the voltage source 13a), and is compared by the second comparator 2b with the above voltage THRESHOLD low/THRESHOLD L (provided by the voltage source 13b).

If the voltage present at the pad 1 is below the voltage level THRESHOLD high/THRESHOLD H, and above the voltage level THRESHOLD low/THRESHOLD L, that is, if the voltage present at the pad 1 is in the above "read level" (see FIGS. 3 and 4), the output OUTH of the first comparator 2a and the output OUTL of the second comparator 2b each are logic high. Hence, the output of the AND gate 15 stays logic high, indicating that the integrated circuit is in the above reading mode, where data is to be output from the integrated circuit via the pad 1. In the reading mode, the current flowing through the pad 1 is evaluated from an (external) device connected to the pad 1, for example, the above test apparatus/ tester, or (further) integrated circuit, etc.

As said above, the data to be output by the interface 11/the pad 1 during the reading mode (that is, the data DATA OUT present at the plurality of parallel lines 25) is serialized by the shift register 24, and the respective serialized data as will be described in further detail below is output by the shift register 24 in the form of the above signal Bit OUT present at the line 23.

If for example, a Bit "1" (or alternatively a Bit "0") is to be output via the pad 1, the signal Bit OUT for example, may be logic high, such that the current source 22 is activated, and the current source 21 is deactivated. In this case, the above relatively high current Isource is provided by the current source 22 to the pad 1, for example, the above positive current of approximately +30 μA.

Similarly, if for example, a Bit "0" (or alternatively a Bit "1") is to be output via the pad 1, the signal Bit OUT for example, may be logic low, such that the current source 22 is deactivated, and the current source 21 is activated. In this case, the above negative current Isink is provided by the current source 22 to the pad 1, for example, the above negative current of approximately −30 μA.

If then for example, a Bit "0" (or alternatively a Bit "1") is to be input into the integrated circuit, a voltage lower than the above voltage level THRESHOLD low/THRESHOLD L, for example, a voltage of approximately 0V is applied at the pad 1 (see FIG. 4 "write L"). This voltage may be provided by the above (external) device connected to the pad 1, for example, the above test apparatus/tester, or (further) integrated circuit, etc., for example, between the time t1 and the time t2 illustrated in FIG. 4.

If the voltage at the pad 1 is lower than the voltage level THRESHOLD low/THRESHOLD L, the output OUTL of the second comparator 2b becomes logic low, whilst the output OUTH of the first comparator 2a stays logic high. Hence, the output of the AND gate 15, and therefore, the clock output (CLK output) at the line 18 becomes logic low. This as will be further described below has no influence on (further) elements of the integrated circuit, as these elements are not triggered by negative, but by positive flanks of the clock output (CLK output).

As the output OUTL of the second comparator 2b becomes logic low, the RS Flip Flop 16 is reset. Hence, the output of the Flip Flop 16 which is connected to the line 19 becomes logic low, indicating that a Bit "0" (or alternatively a Bit "1") was received by the interface 11/integrated circuit.

If thereafter again the voltage present at the pad 1 changes to a level below the voltage level THRESHOLD high/ THRESHOLD H, and above the voltage level THRESHOLD low/THRESHOLD L, that is, if the voltage present at the pad 1 then again is changed to be in the above "read level" (for example, at the above time t2, see FIG. 4), the output OUTL of the second comparator 2b again becomes logic high (the output OUTH of the first comparator 2a still stays logic high).

Hence, the output of the AND gate 15, and therefore, the clock output (CLK output) at the line 18 becomes logic high again.

By this positive flank of the clock output (CLK output), it might be triggered that the data present at the line 19 (that is, DATA at the output of the interface 11) is read by subsequent elements in the integrated circuit.

In addition, by this positive flank of the clock output (CLK output), it might be triggered that the data in the shift register 24 is shifted, such that for example, at the above time t2, see FIG. 4, the signal Bit OUT present at the line 23 might change its state according to the (new) data to be output via the pad.

If then for example, a Bit "1" is to be output, the signal Bit OUT for example, may change to logic high, such that the current source 22 is activated, and the current source 21 is deactivated. In this case, the above relatively high current Isource is provided by the current source 22 to the pad 1, for example, the above positive current of approximately +30 µA.

If then for example, a Bit "1" is to be input into the integrated circuit, for example, beginning at a time t3 as illustrated in FIG. 4 a voltage higher than the above voltage level THRESHOLD high/THRESHOLD H, for example, a voltage of approximately 5V is applied at the pad 1 (see FIG. 4 "write H").

If the voltage at the pad 1 is higher than the voltage level THRESHOLD high/THRESHOLD H, the output OUTH of the first comparator 2a becomes logic low, whilst the output OUTL of the second comparator 2b stays logic high.

Hence, the output of the AND gate 15, and therefore, the clock output (CLK output) at the line 18 becomes logic low, which as said has no influence on (further) elements of the integrated circuit, as these elements are not triggered by negative, but by positive flanks of the clock output (CLK output).

As the output OUTH of the first comparator 2a becomes logic low, the RS Flip Flop 16 is set. Hence, the output of the Flip Flop 16 which is connected to the line 19 becomes logic high, indicating that a Bit "1" was received by the interface 11/integrated circuit.

Thereafter again as illustrated in FIG. 4 the voltage present at the pad 1 is changed to a level below the voltage level THRESHOLD high/THRESHOLD H, and above the voltage level THRESHOLD low/THRESHOLD L, that is, to the above "read level" (for example, at the above time t4, see FIG. 4). Hence, the output OUTH of the first comparator 2a again becomes logic high (the output OUTL of the second comparator 2b still stays logic high).

Hence, the output of the AND gate 15, and therefore, the clock output (CLK output) at the line 18 becomes logic high again.

By this positive flank of the clock output (CLK output), again, it is triggered that the data present at the line 19 (that is, DATA at the output of the interface 11) is read by subsequent elements in the integrated circuit.

In addition, by this positive flank of the clock output (CLK output), it is triggered that the data in the shift register 24 is further shifted, such that for example, at the above time t4, see FIG. 4, the signal Bit OUT present at the line 23 again might change its state according to the (new) data to be output via the pad.

Hence, by respectively timing/coding the data input into the integrated circuit (here: the voltage applied to the pad 1), it is possible to regenerate a clock (here: the CLK output) which is both used as a "read clock" to coordinate the timing of the output of data via the shift register 24, and as a "write clock" to coordinate the timing of the further processing of the input data internally in the integrated circuit.

In one embodiment (now illustrated), the way to input and output data may be inverse as described above: In this case, if for example, a Bit "1" (or alternatively a Bit "0") is to be output from the integrated circuit, a voltage bigger than the above voltage level THRESHOLD high/THRESHOLD H, for example, a voltage of approximately 5V may be applied at the pad 1 from a device internal of the integrated circuit, for example, a respective internal voltage source. In contrast, if a Bit "0" (or alternatively a Bit "1") is to be output from the integrated circuit, a voltage lower than the above voltage level THRESHOLD low/THRESHOLD L, for example, a voltage of approximately 0V may be applied at the pad 1, for example, by the above internal voltage source or an additional internal voltage source.

Further, if a Bit "1" (or alternatively a Bit "0") is to be input into the integrated circuit, a relatively high current Isource, for example, a positive current of approximately +30 µA may be applied at the pad 1 from an external current source, for example, located at a test apparatus or a further integrated circuit. In contrast, if a Bit "0" (or alternatively a Bit "1") is to be input into the integrated circuit, a current lower than the above current Isource, that is, a relatively low current Isink, for instance a negative current, for example, a current of approximately –30 µA may be applied at the pad 1 from the above external current source or an additional external current source also located at the above test apparatus or further integrated circuit.

Figure 2:
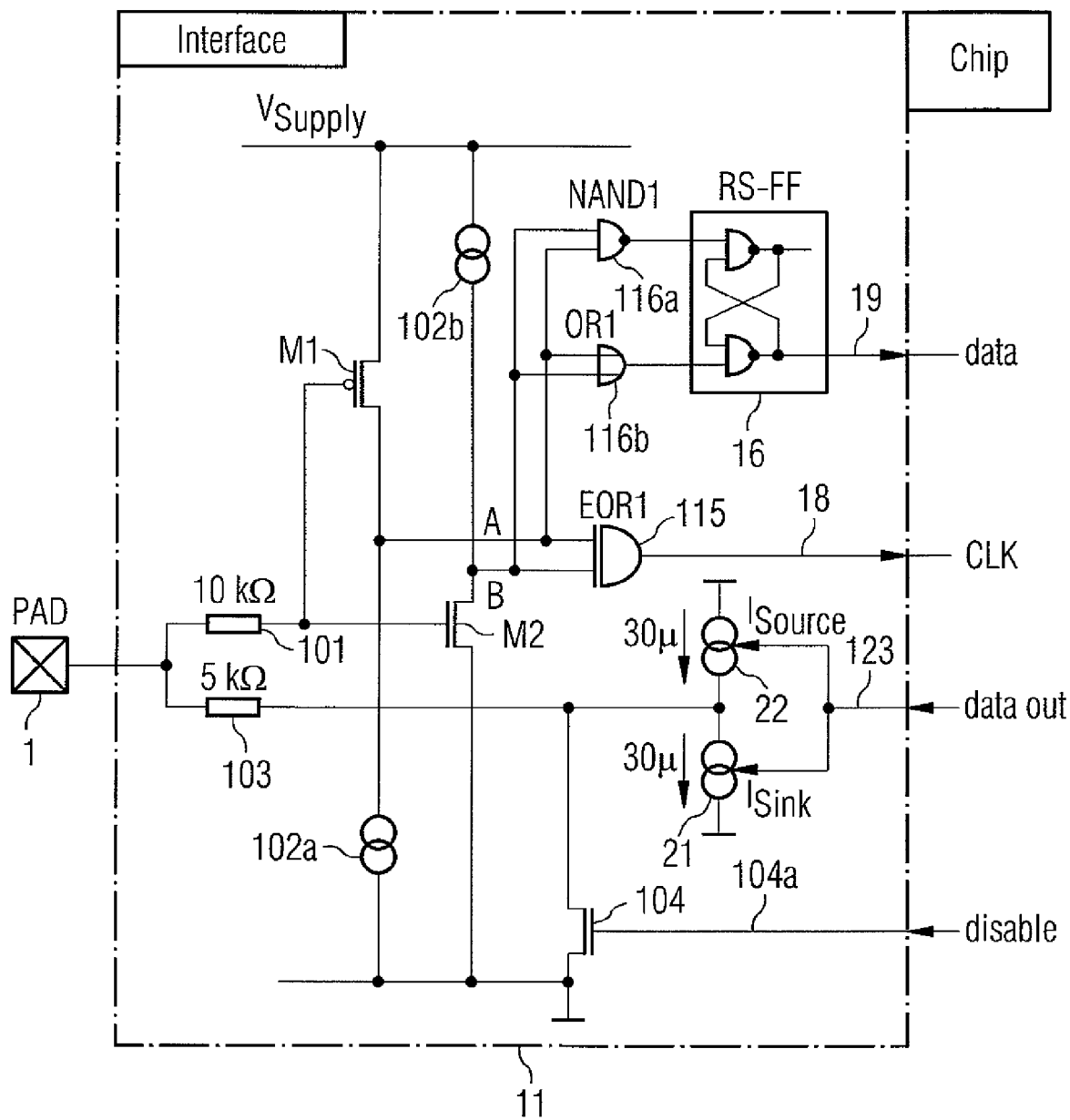
FIG. 2 illustrates a detailed, exemplary circuit diagram of the integrated circuit.

FIG. 2 illustrates a detailed, exemplary circuit diagram indicating how the interface 11/the integrated circuit section according to the embodiment illustrated in FIG. 1 may be implemented.

As is illustrated in FIG. 2, the first and second comparators 2a, 2b are implemented by respective transistors M1, M2 (here: a p-channel MOSFET M1, and an n-channel MOSFET M2), and respective bias current sources 102a, 102b connected to the drains of the respective transistors M1, M2. The p-channel MOSFET M1 has a respective threshold voltage Vthp, and the n-channel MOSFET M2 has a respective threshold voltage Vthn.

The source of the transistor M1 is connected to a voltage supply providing a supply voltage Vsupply, and the source of the transistor M2 is connected to ground.

The gate of the transistor M1 and the gate of the transistor M2 are each connected to the pad 1 (here: via a resistor 101).

Further, correspondingly similar as illustrated in FIG. 1, the current sources 21, 22 are connected with each other, and also are connected to the pad 1 (here: via a resistor 103).

The current sources 21, 22 for example, may be built by respective switchable current mirrors.

In addition, the current sources 21, 22 and the resistor 103 are connected to a transistor 104 (here: to the drain of an n-channel MOSFET 104). The transistor 104 (here: the source of the n-channel MOSFET 104) is connected to ground. By applying a respective signal via a line 104a at the gate of the transistor 104, the interface 11 may be enabled/disabled.

As is further illustrated in FIG. 2, the drain of the transistor M1 additionally is connected to a first input of an Exclusive-OR gate 115 (EOR1). Further, the drain of the transistor M2 additionally is connected to a second input of the Exclusive-OR gate 115 (EOR1). The output of the Exclusive-OR gate 115 is connected via the line 18 to a clock output (clk).

Still further, the drain of the transistor M1 additionally is connected to a first input of an OR gate 116b (OR1), and a second input of a NAND gate 116a (NAND1). Further, the drain of the transistor M2 is connected to a second input of the OR gate 116b (OR1), and a first input of the NAND gate 116a (NAND1). The outputs of the NAND gate 116a and the OR gate 116b are connected to respective SET/RESET inputs of the RS Flip Flop 16. The output of the RS Flip Flop 16 is connected via the line 19 to the data output ("data") of the interface 11.

The reference voltage level THRESHOLD low/THRESHOLD L mentioned above with respect to FIG. 1 corresponds to the above threshold voltage Vthn of the n-channel MOSFET M2 in FIG. 2. Correspondingly, the above reference voltage level THRESHOLD high/THRESHOLD H corresponds to a voltage of Vsupply–Vthp in FIG. 2.

If the voltage present at the pad 1 is at a level below the voltage level THRESHOLD high/THRESHOLD H, and above the voltage level THRESHOLD low/THRESHOLD L, that is, if the voltage present at the pad 1 is in the above "read level", the current sources 21, 22 depending on the state of a signal "data out" at the line 123 may drive—depending on the respective data to be output by the interface 11—either a current Isource from Vsupply in the direction of the pad 1, or a current Isink from the pad 1 to ground.

If as said the voltage present at the pad 1 is in the above "read level", the clock output (clk) at the line 18 is logic high, as the transistors M1, M2 then are conducting, such that the first input (A) of the Exclusive-OR gate 115 (EOR1) is logic high, and the second input (B) of the Exclusive-OR gate 115 (EOR1) is logic low.

The output of the RS Flip Flop/the data output of the interface 11 ("data") at the line 19 then remains unchanged, as the outputs of the NAND gate 116*a* (NAND1) and the OR gate 116*b* (OR1) are logic high, such that the RS Flip Flop 16 does not switch.

If the voltage present at the pad 1 is out of the "read level" (that is, higher than THRESHOLD high/THRESHOLD H, or lower than THRESHOLD low/THRESHOLD L), the clock output (clk) at the line 18 is logic low.

Further, the output of the RS Flip Flop 16, that is, the state of the line 19 then is either set to logic low (if the voltage present at the pad 1 is lower than THRESHOLD low/THRESHOLD L), or to logic high (if the voltage present at the pad 1 is higher than THRESHOLD high/THRESHOLD H).

If the voltage present at the pad 1 then returns to the above "read level", the clock output (clk) at the line 18 again gets logic high.

By this positive flank of the clock output (clk), correspondingly similar as described above with respect to FIG. 1, it might be triggered that the data present at the line 19 ("data") is read by subsequent elements in the integrated circuit/chip, and that the next data ("data out") to be output by the interface 11 is provided at the line 123, for example, by a shift register corresponding to the shift register 24 illustrated in FIG. 1.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating an integrated circuit, comprising:

applying a voltage to a line or a connection in accordance with data to be input; and applying a current to the line or the connection in accordance with data to be output, whereby applying the voltage to the line or the connection in accordance with data to be input comprises applying a voltage bigger than a first threshold to the line or connection when a first data is to be input, and applying a voltage smaller than a second threshold to the line or connection when a second data different from the first data is to be input.

2. The method of claim 1, wherein the connection is a pad of the integrated circuit.

3. The method of claim 1, wherein the connection is a pin of a housing of the integrated circuit.

4. The method of claim 1 comprising applying the voltage by a test apparatus connected to the line or connection.

5. The method of claim 1 comprising applying the voltage by a further integrated circuit connected to the line or connection.

6. The method of claim 1, wherein the first threshold is bigger than the second threshold.

7. The method of claim 6 comprising applying a voltage between the first and the second threshold to the line or the connection.

8. The method of claim 1, whereby applying the current to the line or the connection in accordance with data to be output comprises applying a first current to the line or connection when a first data is to be output, and applying a second current to the line or connection when a second data different from the first data is to be output.

9. The method of claim 8, wherein the first current is a positive current, and the second current is a negative current.

10. The method of claim 1 comprising applying the voltage and the current in accordance with the data to be input and the data to be output at the same time.

11. A method for operating an integrated circuit, comprising:

applying a voltage to a connection of the integrated circuit in accordance with data to be output from the integrated circuit; and applying a current to the connection in accordance with data to be input into the integrated circuit, whereby applying the voltage to the connection in accordance with data to be output comprises applying a voltage bigger than a first threshold to the connection when a first data is to be output, and applying a voltage smaller than a second threshold to the connection when a second data different from the first data is to be output.

12. The method of claim 11, whereby applying the current to the connection in accordance with data to be input comprises applying a first current to the connection when a first data is to be input, and applying a second current to the connection when a second data different from the first data is to be input.

13. An integrated circuit, comprising a bidirectional connection for the input and output of data which is configured to be operated in a write mode when a voltage at the bidirectional connection is greater than a first threshold or smaller than a second threshold, and to be operated in a read mode when the voltage at the bidirectional connection is less than the first threshold and greater than the second threshold.

14. The circuit of claim 13 comprising at least one current source for applying a current to the connection in accordance with data to be output.

15. The circuit of claim 13 comprising at least one evaluation device for evaluating a voltage applied to the connection.

16. The circuit of claim 15, wherein the evaluation device comprises a comparator.

17. The circuit of claim 15, wherein the evaluation device comprises a transistor.

18. The circuit of claim 15, wherein the evaluation device is coupled with a Flip Flop.

19. The circuit of claim 15, wherein the evaluation device is coupled with a clock regeneration device.

20. The circuit of claim 18, wherein the clock regeneration device comprises an AND gate.

21. The circuit of claim 18, wherein the clock regeneration device comprises an Exclusive-OR gate.

22. An electronic system, comprising the integrated circuit of claim 13.

23. A semi-conductor component comprising:
means for applying a current to a line or a connection in accordance with data to be output, and
means for evaluating a voltage applied to the line or the connection in accordance with data to be input, including means for applying a voltage greater than a first threshold to the line or connection when a first data is to be input, and means for applying a voltage smaller than a second threshold to the line or connection when a second data different from the first data is to be input.

* * * * *